United States Patent
Yang et al.

(10) Patent No.: US 7,338,898 B2
(45) Date of Patent: Mar. 4, 2008

(54) MOS TRANSISTOR AND FABRICATION THEREOF

(75) Inventors: Chih-Wei Yang, Kaohsiung County (TW); Yi-Sheng Hsieh, Taichung County (TW); Wei-Min Lin, Hsinchu County (TW); Wen-Tai Chiang, Taipei County (TW); Wei-Tsun Shiau, Kaohsiung County (TW)

(73) Assignee: United Microelectronics Corp., Hsinchu (TW)

( * ) Notice: Subject to any disclaimer, the term of this patent is extended or adjusted under 35 U.S.C. 154(b) by 83 days.

(21) Appl. No.: 11/163,894

(22) Filed: Nov. 3, 2005

(65) Prior Publication Data

US 2006/0040482 A1    Feb. 23, 2006

Related U.S. Application Data

(62) Division of application No. 10/710,199, filed on Jun. 25, 2004, now Pat. No. 7,145,208.

(51) Int. Cl.
*H01L 21/44* (2006.01)

(52) U.S. Cl. .............. 438/653; 438/199; 438/287; 438/643; 438/E21.62

(58) Field of Classification Search ........ 438/197–198, 438/257–258, 593–594, 652–654; 257/407, 257/314–315, 10
See application file for complete search history.

(56) References Cited

U.S. PATENT DOCUMENTS

2004/0178458 A1* 9/2004 Eppich et al. ............... 257/402
2005/0023602 A1* 2/2005 Forbes et al. ............... 257/315

* cited by examiner

*Primary Examiner*—Dung A. Le
(74) *Attorney, Agent, or Firm*—Jianq Chyun IP Office

(57) ABSTRACT

A method for fabricating a MOS transistor is described. A gate dielectric layer, a first barrier layer, an interlayer, a work-function-dominating layer, a second barrier layer and a poly-Si layer are sequentially formed on a substrate. The interlayer is capable of adjusting the work function of the work-function-dominating layer and wetting the surface of the first barrier layer. The above layers are then patterned into a gate, and a source/drain is formed in the substrate beside the gate.

12 Claims, 4 Drawing Sheets

MOS TRANSISTOR AND FABRICATION THEREOF

CROSS-REFERENCE TO RELATED APPLICATION

This application is a divisional of a prior application Ser. No. 10/710,199, filed Jun. 25, 2004 now U.S. Pat. No. 7,145,208. All disclosures are incorporated herewith by reference.

BACKGROUND OF THE INVENTION

1. Field of the Invention

The present invention relates to a semiconductive device and a method for fabricating the same. More particularly, the present invention relates to a metal-oxide-semiconductor (MOS) transistor and a method for fabricating the same.

2. Description of the Related Art

In a typical MOS process, a gate oxide layer and a poly-Si layer are sequentially formed on a substrate, and then the poly-Si layer is patterned into a gate using lithography and etching techniques. Thereafter, ion implantation is conducted to form a source/drain region in the substrate beside the gate.

The conventional material of MOS gates is doped poly-Si. However, poly-Si is not an ideal gate material in advanced processes for having higher resistance and easily inducing gate depletion to cause voltage loss. Therefore, metal is currently used to form the gates in many advanced MOS processes. However, since the metal atoms in a metal gate easily diffuse to, for example, the channel region, the performance of the MOS transistor is not reliable.

On the other hand, there exists optimal wok functions for an NMOS gate and a PMOS gate, respectively. When the work functions of the NMOS gate and the PMOS gate are not optimized respectively, the performance of the CMOS device cannot be well adjusted. Therefore, it is highly desired to develop a method for controlling the work functions of different types of MOS gates.

SUMMARY OF THE INVENTION

In view of the foregoing, this invention provides a MOS transistor and a method for fabricating the same, which are capable of solving the aforementioned problems of the conventional MOS transistors having poly-Si gates or metal gates.

Another object of this invention is to provides a MOS transistor and a method for fabricating the same, which allow the work function of the gate to be adjusted as required.

The method for fabricating a MOS transistor of this invention is described as follows. A gate dielectric layer, a first barrier layer, an interlayer, a work-function-dominating layer, a second barrier layer and a poly-Si layer are sequentially formed on a substrate. The poly-Si layer, the second barrier, the work-function-dominating layer, the interlayer and the first barrier layer are then patterned into a gate, and a source/drain is formed in the substrate beside the gate.

The MOS transistor of this invention includes a substrate, a gate dielectric layer on the substrate, a stacked gate on the gate dielectric layer, and a source/drain in the substrate beside the stacked gate. The stacked gate includes, from bottom to top, a first barrier layer, an interlayer, a work-function-dominating layer, a second barrier layer and a poly-Si layer.

As its name indicates, the work-function-dominating layer dominates the work function of the gate. The first barrier layer is capable of preventing the atoms in the work-function-dominating layer from diffusing to the substrate. Particularly, the interlayer on the first barrier layer can adjust the work function of the work-function-dominating layer as well as provide better adhesion between the first barrier layer and the work-function-dominating layer.

It is to be understood that both the foregoing general description and the following detailed description are exemplary, and are intended to provide further explanation of the invention as claimed.

DESCRIPTION OF THE REFERRED EMBODIMENTS

Figure 1A:
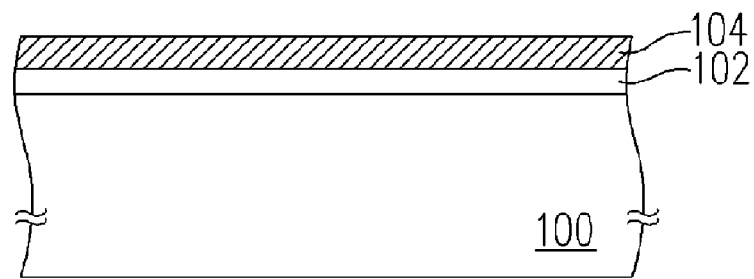
FIGS. 1A-1I illustrate a process flow of fabricating a MOS transistor according to a preferred embodiment of this invention.

Referring to FIG. 1A, a substrate 100 is provided, which is a silicon substrate, for example, and is preferably a doped single-crystal silicon substrate. A gate dielectric layer 102 is then formed on the substrate 100 using, for example, a chemical vapor deposition (CVD) method. The gate dielectric layer 102 may include a common dielectric material like silicon oxide or silicon nitride, or preferably a high-K material defined as a material having a high dielectric constant.

A first barrier layer 104 is then formed on the gate dielectric layer 102. The first barrier layer 104 preferably includes a metallic barrier material like TiN. TaN or TiN/Ti.

Figure 1B:
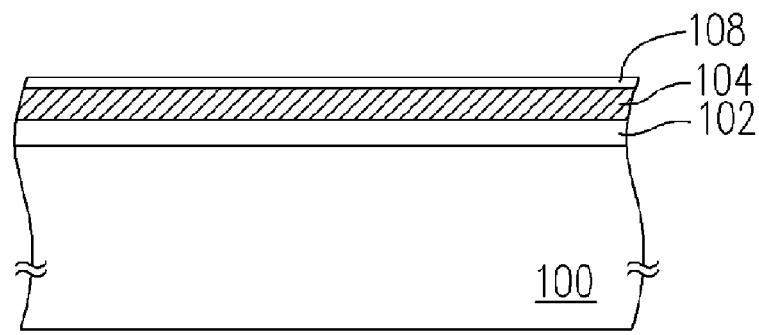
Figure 1C:
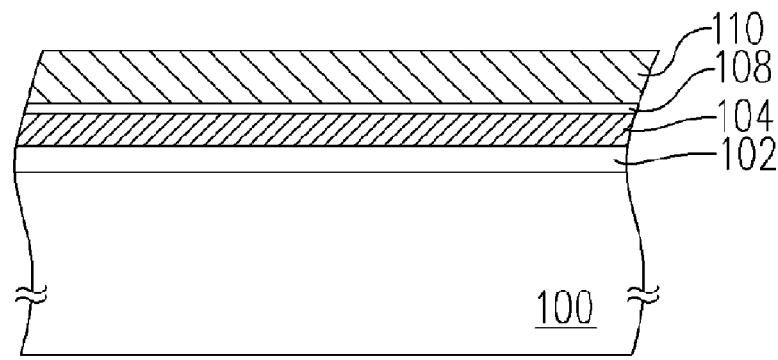

Referring to FIGS. 1B and 1C, an interlayer 108 and a work-function-dominating layer 110 are sequentially formed on the first barrier layer 104. The work-function-dominating layer 110 dominates the work function of the MOS gate that will be formed latter, and is preferably a metallic layer including any metallic material having a satisfactory work function. The interlayer 108 is formed prior to the work-function-dominating layer 110 for adjusting the work function of the latter. It is more preferable that the interlayer 108 can also wet the surface of the first barrier layer 104, so that the adhesion between the first barrier layer 104 and the work-function-dominating layer 110 can be enhanced.

More specifically, to adjust the work function of the work-function-dominating layer 110, the interlayer 108 is formed as a nucleation layer that is capable of controlling the crystal orientation of the work-function-dominating layer 110. It is because the work function of the work-function-dominating layer 110 is not only dominated by its material and phase but also affected by its crystal orientation, as described in Herbert B. Michaelson, "The work function of the elements and its periodicity", *J. Appl. Phys.*, Vol. 48, No. 1, p. 4729, 1977. In one embodiment, the interlayer 108 may include a metallic layer, which is formed with a deposition process, a surface treatment to the first barrier layer 104, or a deposition process and a post-deposition surface treatment. The deposition process is preferably a physical vapor deposition (PVD) process, an atomic layer deposition (ALD) process or a metal-organic chemical vapor deposition (MOCVD) process. The surface treatment or the post-deposition surface treatment is preferably a surface nitridation treatment.

Figure 1D:
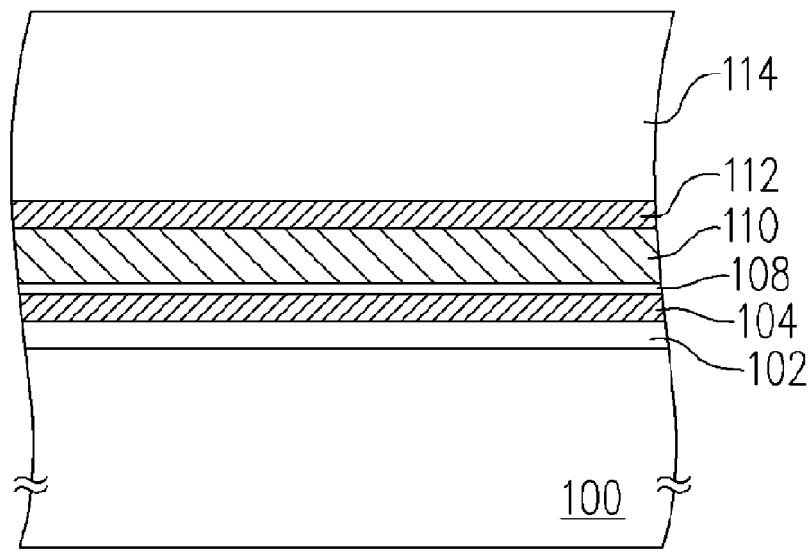

Referring to FIG. 1D, a second barrier layer 112 is formed on the work-function dominating layer 110, and then a poly-Si layer 114 is formed on the second barrier layer 112. The second barrier layer 112 preferably includes a metallic material, such as, TiN, TaN or TiN/Ti. The poly-Si layer 114 is preferably a poly-Si layer that is doped in situ.

Figure 1E:
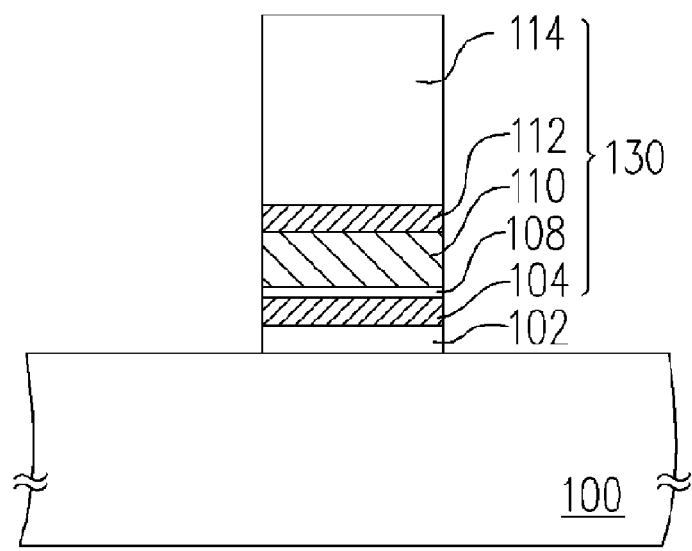

Referring to FIG. 1E, the poly-Si layer 114, the second barrier layer 112, the work-function-dominating layer 110, the interlayer 108 and the first barrier layer 104 are then patterned into a gate 130. The patterning process includes, for example, a lithography step and an etching step as usual. After the gate 130 is defined, the etching step may be continued to remove the exposed gate dielectric layer 102 and expose the surface of the substrate 100 not under the gate 130.

Figure 1F:
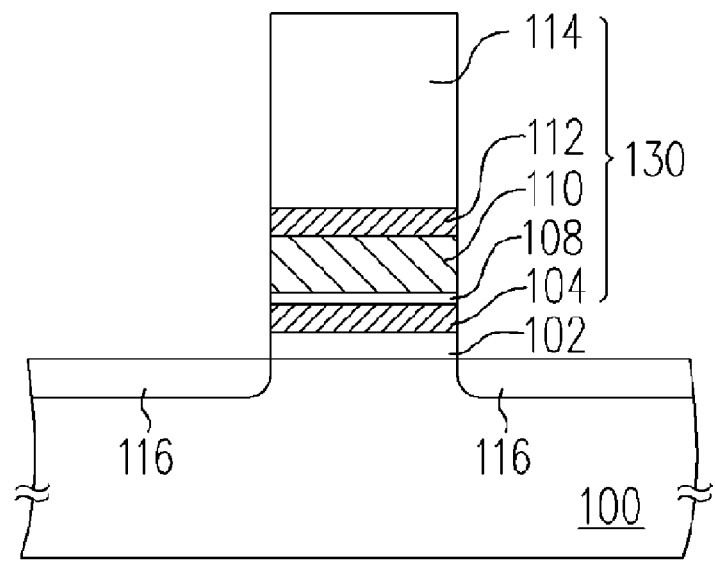
Figure 1G:
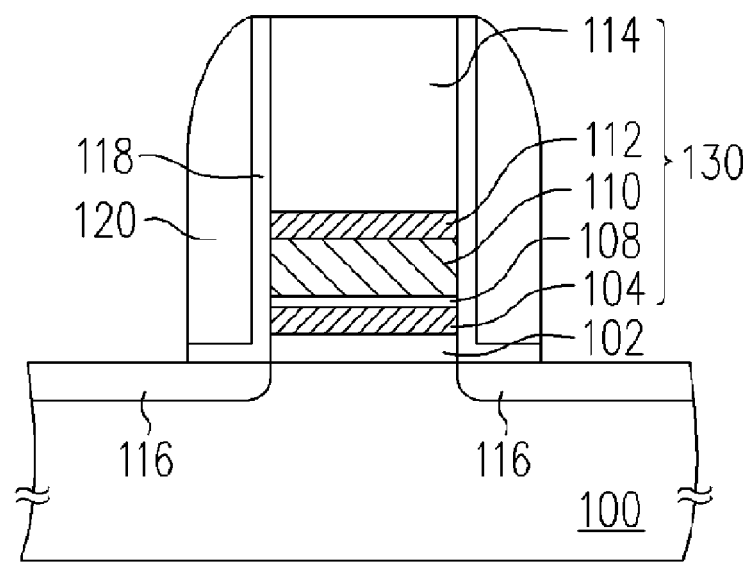
Figure 1H:
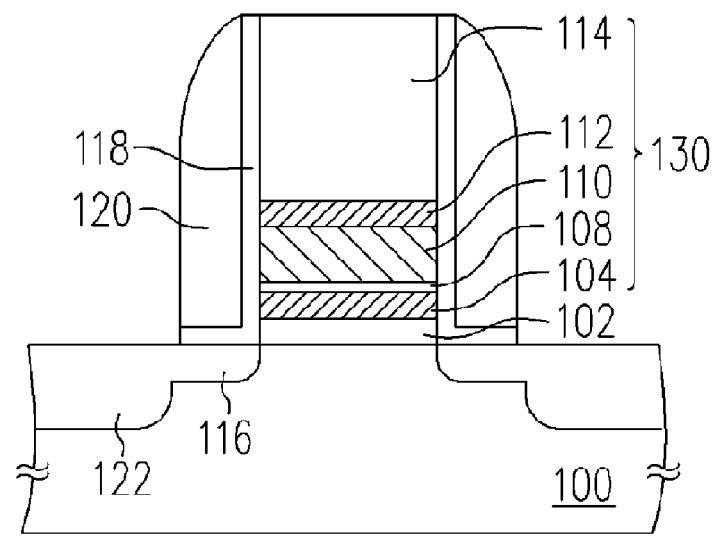

Thereafter, two doped regions serving as a source region and a drain region, respectively, are formed in the substrate 100 beside the gate 130, wherein each doped region preferably includes a lightly doped drain (LDD). A preferable method to form the two doped regions is illustrated in FIGS. 1F-1H. Referring to FIG. 1F, shallow LDD regions 116 are formed in the substrate 100 beside the gate 130 with an ion implantation process using the gate 130 as a mask. Referring to FIG. 1G, a spacer 120 is formed on the sidewall of the gate 130, while it is more preferable to form a liner layer 118 on the sidewall of the gate 130 prior to the spacer 120. Referring to FIG. 1H, a deeper source/drain region (S/D region) 122 is formed in the substrate 100 beside the spacer 120 with another ion implantation process using the gate 130 and the spacer 120 as a mask.

After the S/D region 122 is formed, a metal silicide layer 132 is preferably further formed on the gate 130 and the S/D region 122 to reduce the resistance of the electrodes. The metal silicide layer 132 can be formed using any existing method, for example, a self-aligned silicide (salicide) process. A salicide process essentially includes depositing a metal on the substrate 100, conducting a thermal process to react the metal with the surface silicon atoms of the poly-Si layer 114 and the substrate 100 to form metal silicide, and then removing the unreacted metal. The spacer 120 can prevent the metal silicide layer 132 on the gate 130 from contacting and shorting with the metal silicide layer 132 on the S/D region 122.

Figure 1I:
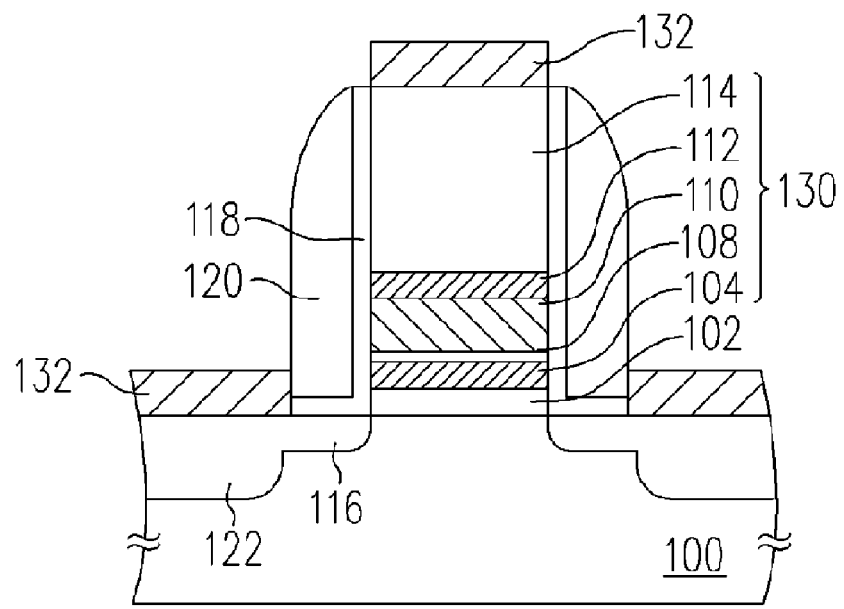

Accordingly, referring to FIG. 1I, the MOS transistor formed with the above steps of the preferred embodiment of this invention includes at least a gate dielectric layer 102 on the substrate 100, a gate 130 on the gate dielectric layer 102, and a source/drain region 122 in the substrate 100 beside the gate 130.

Particularly, the gate 130 is a stacked structure including, from bottom to top, a first barrier layer 104, an interlayer 108, a work-function-dominating layer 110, a second barrier layer 112 and a poly-Si layer 114. The first barrier layer 104 is for preventing interaction between the work-function-dominating layer 110 and the gate dielectric layer 102. The first barrier layer 104 can also prevent the atoms in the work-function-dominating layer 110 from diffusing into the channel region in the underlying substrate 100 to deteriorate the properties of the device. The second barrier layer 112 is for preventing reactions between the poly-Si layer 114 and the work-function-dominating layer 110.

The work-function-dominating layer 110 is the layer dominating the work function of the gate 130, and has a sufficiently larger thickness relative to the total thickness of the first barrier layer 104 and the second barrier layer 110, so that the work function thereof is substantially not affected by the latter.

The interlayer 108 under the work-function-dominating layer 110 acts as a nucleation layer capable of controlling the crystal orientation of the work-function-dominating layer 110 to adjust the work function of the same. It is because the work function of the work-function-dominating layer 110 is not only dominated by its material and phase but also affected by its crystal orientation, as mentioned above. For the same reason mentioned above, the interlayer 108 must be sufficiently thinner relative to the work-function-dominating layer 110 to not affect the work function of the latter substantially.

With the combination of the interlayer 108 and the work-function-dominating layer 110, it is possible to make different types of semiconductor devices respectively have different gate work functions. For example, the optimal work function for an NMOS gate is about 4.1 eV, while that for a PMOS is about 5.1 eV. More specifically, since the interlayer 108 can adjust the work function of the work-function-dominating layer 110, a required work function can be achieved by selecting a suitable material for the work-function-dominating layer 110 and choosing a proper material and/or a proper forming method for the interlayer 108. Furthermore, the work function of the work-function-dominating layer 110 can also be varied as required through the formation, possibly with additional post-formation treatment, of the interlayer 108, so that different work functions can be achieved for different types of devices.

In addition, the interlayer 108 preferably has the function of wetting the first barrier layer 104, so that the adhesion between the first barrier layer 104 and the work-function-dominating layer 110 can be enhanced.

Since the gate 130 of the MOS transistor includes a low-resistance work-function-dominating layer 110 in addition to the poly-Si layer 114, the resistance of the gate 130 can be reduced. Moreover, the thickness of the poly-Si layer 114 is larger than the total thickness of the other stacked layers 104, 108, 110 and 112, so that the etching process for forming the gate 130 is easier than before. Furthermore, since the first barrier layer 104 is disposed between the work-function-dominating layer 110 and the substrate 100, the atoms in the metal gate 130 can be prevented from diffusing into the substrate 100.

In addition, except the gate 130, the gate dielectric layer 102 and the S/D region 122, the MOS transistor may further includes a spacer 120 on the sidewall of the gate 130 and a pair of lightly doped drains 116 in the substrate 100 beside the gate 130 connecting with the S/D region 122.

Moreover, a metal silicide layer 132 may be further disposed on the gate 130 and the S/D region 122 to reduce the resistance of the electrodes.

In summary, the MOS gate of this invention has a stacked structure including a first barrier layer, an interlayer, a work-function-dominating layer, a second barrier layer and a poly-Si layer. The work-function-dominating layer dominates the work function of the gate, and the first barrier can prevent the atoms in the work-function-dominating layer from diffusing into the substrate. The second barrier layer can prevent reaction between the work-function-dominating layer and the poly-Si layer. Particularly, the interlayer can not only adjust the work function of the work-function-dominating layer, but also wet the surface of the first barrier layer to enhance the adhesion between the first barrier layer and the work-function-dominating layer.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating a MOS transistor, comprising:
   forming a gate dielectric layer on a substrate;
   forming a first barrier layer on the gate dielectric layer;
   forming an interlayer on the first barrier layer, wherein the interlayer is capable of controlling a crystal orientation of a work-function-dominating layer to adjust a work function of the work-function-dominating layer;
   forming a work-function-dominating layer on the interlayer;
   forming a second barrier layer on the work-function-dominating layer;
   forming a poly-Si layer on the second barrier layer;
   patterning the poly-Si layer, the second barrier layer, the work-function-dominating layer, the interlayer and the first barrier layer into a gate; and
   forming a source/drain in the substrate beside the gate.

2. The method according to claim 1, wherein forming the interlayer on the first barrier layer comprises performing a deposition process.

3. The method according to claim 2, wherein the deposition process comprises a physical vapor deposition (PVD) process, an atomic layer deposition (ALD) process or a metal-organic chemical vapor deposition (MOCVD) process.

4. The method according to claim 1, wherein forming the interlayer on the first barrier layer comprises performing a surface treatment to the first barrier layer.

5. The method according to claim 4, wherein the surface treatment comprises surface nitridation.

6. The method according to claim 1, wherein forming the interlayer on the first barrier layer comprises performing a deposition process and a post-deposition surface treatment.

7. The method according to claim 6, wherein the post-deposition surface treatment comprises surface nitridation.

8. The method according to claim 1, wherein the interlayer is capable of wetting a surface of the first barrier layer.

9. The method according to claim 1, wherein a thickness of the interlayer is smaller than a thickness of the work-function-dominating layer.

10. The method according to claim 1, wherein a thickness of the work-function-dominating layer is larger than a total thickness of the first and second barrier layers.

11. The method according to claim 1, wherein the gate dielectric layer comprises a high-K dielectric layer.

12. The method according to claim 1, further comprising the following steps before the source/drain is formed:
    forming a pair of lightly doped drains in the substrate beside the gate; and
    forming a spacer on a sidewall of the gate,
    wherein the spacer will serve as a mask together with the gate in the latter step of forming the source/drain.

* * * * *